United States Patent
Tong et al.

(10) Patent No.: US 9,136,201 B2
(45) Date of Patent: Sep. 15, 2015

(54) HYBRID HEAT SINK AND HYBRID HEAT SINK ASSEMBLY FOR POWER MODULE

(75) Inventors: Aixing Tong, Shanghai (CN); Teng Liu, Shanghai (CN); Jianping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 293 days.

(21) Appl. No.: 13/557,158

(22) Filed: Jul. 24, 2012

(65) Prior Publication Data

US 2013/0155616 A1    Jun. 20, 2013

(30) Foreign Application Priority Data

Dec. 16, 2011    (CN) .......................... 2011 1 0424870

(51) Int. Cl.
| | |
|---|---|
| *H01L 23/427* | (2006.01) |
| *H05K 7/20* | (2006.01) |
| *H01L 23/467* | (2006.01) |
| *F28D 15/02* | (2006.01) |

(52) U.S. Cl.
CPC .......... *H01L 23/427* (2013.01); *F28D 15/0275* (2013.01); *H01L 23/467* (2013.01); *H05K 7/2039* (2013.01); *H05K 7/20909* (2013.01); *H05K 7/20918* (2013.01); *H05K 7/20936* (2013.01); *H01L 2924/0002* (2013.01)

(58) Field of Classification Search
CPC ... H01L 23/427; H01L 23/3672; H01L 23/46; F28D 15/02; F28D 15/0275; H05K 7/2089–7/20945

USPC ............ 361/679.47–679.48, 679.52, 679.54, 361/694–695, 697, 700, 703–704; 165/104.21, 104.26, 185

See application file for complete search history.

(56) References Cited

U.S. PATENT DOCUMENTS

| | | | | |
|---|---|---|---|---|
| 5,925,929 | A * | 7/1999 | Kuwahara et al. | 257/714 |
| 7,174,951 | B1 * | 2/2007 | Lin | 165/104.33 |
| 7,245,494 | B2 * | 7/2007 | Cheng | 361/700 |
| 7,269,012 | B2 * | 9/2007 | Lee et al. | 361/700 |
| 7,269,014 | B1 * | 9/2007 | Zhao et al. | 361/700 |
| 7,414,841 | B2 * | 8/2008 | Chen et al. | 361/697 |

(Continued)

FOREIGN PATENT DOCUMENTS

| | | | | |
|---|---|---|---|---|
| EP | 0771138 A1 * | 5/1997 | | H05K 7/20 |
| EP | 2290681 A2 * | 3/2011 | | H01L 23/427 |

(Continued)

*Primary Examiner* — Robert J Hoffberg
(74) *Attorney, Agent, or Firm* — CKC & Partners Co., Ltd.

(57) ABSTRACT

Disclosed are a hybrid heat sink and a hybrid heat sink assembly for a power module. The hybrid heat sink comprises a base provided with at least one power module on one side thereof, a first heat dissipation unit being a first heat dissipation fin group which is composed of a plurality of heat dissipation fins intervally arranged and is located on the other side of the base, and a second heat dissipation unit comprising a plurality of heat pipes and a second heat dissipation fin group. Each of the heat pipes comprises an evaporating section provided in the base and close to the power module, a condensing section, and an adiabatic section located between the evaporating section and the condensing section and comprises an extension portion and a folding portion, the second heat dissipation fin group is provided on the condensing sections.

8 Claims, 4 Drawing Sheets

(56) References Cited

U.S. PATENT DOCUMENTS

| | | | |
|---|---|---|---|
| 7,643,293 B2 * | 1/2010 | Chu | 361/700 |
| 7,665,508 B2 * | 2/2010 | Liu et al. | 165/104.21 |
| 8,047,270 B2 * | 11/2011 | Xu | 165/104.33 |
| 8,220,528 B2 * | 7/2012 | Li et al. | 165/80.3 |
| 8,755,186 B2 * | 6/2014 | Kitajima et al. | 361/700 |
| 2004/0218367 A1 * | 11/2004 | Lin et al. | 361/721 |
| 2005/0099774 A1 * | 5/2005 | Song | 361/700 |
| 2009/0151899 A1 * | 6/2009 | Chang | 165/80.3 |
| 2009/0219690 A1 * | 9/2009 | Lin et al. | 361/697 |
| 2013/0083485 A1 * | 4/2013 | Tong et al. | 361/700 |
| 2013/0188315 A1 * | 7/2013 | Konishide et al. | 361/700 |
| 2014/0290929 A1 * | 10/2014 | Opila et al. | 165/287 |
| 2014/0293541 A1 * | 10/2014 | Opila et al. | 361/697 |

FOREIGN PATENT DOCUMENTS

| | | | | |
|---|---|---|---|---|
| EP | 2469996 A2 * | 6/2012 | | H05K 7/20 |
| GB | 2148594 A * | 5/1985 | | H01L 23/34 |
| JP | 07169889 A * | 7/1995 | | H01L 23/427 |
| JP | 2951116 B2 * | 9/1999 | | F28D 15/02 |
| JP | 2005322757 A | 11/2005 | | |
| TW | 571613 B | 1/2004 | | |
| TW | 590273 U | 6/2004 | | |
| WO | WO 9939145 A1 * | 8/1999 | | F28D 15/02 |

* cited by examiner

HYBRID HEAT SINK AND HYBRID HEAT SINK ASSEMBLY FOR POWER MODULE

CROSS-REFERENCE TO RELATED APPLICATIONS

This non-provisional application claims priority under 35 U.S.C. §119(a) on Patent Application No. 201110424870.8 filed in P.R. China on Dec. 16, 2011, the entire contents of which are hereby incorporated by reference.

FIELD OF THE PRESENT INVENTION

The present invention relates to a heat dissipation device, and specifically, to a hybrid heat sink and a hybrid heat sink assembly for a power module in which an all-metal type heat sink and a heat-pipe type heat sink are combined together.

BACKGROUND ART

With rapid development of electronic technology, a power density of a power device becomes higher and higher. When the power device is rapidly and frequently switched between turn-on and turn-off, yielded heat is also more and more. In order to assure the power device to work normally, it must dissipate heat in time and efficiently. Since if the heat yielded by the power device can not be dissipated in time and efficiently, a temperature of the power device will be raised, the effectiveness will be lowered and the service life will be reduced in an unserious case, it would result in failure of the power device or device explosion in a serious case. Therefore, the power device package factory and the user of the power device are always puzzled in the heat dissipation problem. High efficient heat dissipation technology is one of important respects always kept on research and development in the electronic industry.

At present, a power module with a large power (the power module is a module which is formed by combining power electronic devices in a certain function and then encapsulating them), such as a SVG (Static Var Generator), a MVD (Medium Voltage Drive), an UPS (Uninterruptible Power System), and a wind power converter, and so on, is mainly composed of an IGBT (insulated gate bipolar transistor) device. A conventional heat dissipation manner is to use an all-metal type heat sink. As shown in FIG. 1, a power device 10 is secured on one side of a heat sink base 20, and a heat dissipation fin group 30 composed of a plurality of heat dissipation fins is on the other side of the heat sink base 20, engagement of the heat sink base 20 and the heat dissipation fin group 30 employs an extrusion formed integral structure or an insert fin type structure or a welding fin structure. In order to make heat yielded by the power device 10 to be efficiently transferred to the heat dissipation fin group 30 and then dissipated to air, it is required that each of the power devices is reasonably arranged on the heat sink base 10 so as to make a temperature of the heat sink base 20 relatively uniform and promote the efficiency of the heat sink. However, as a result, a distance between the power devices is relatively large, electrical connection distance therebetween is increased, the leakage inductance is increased, and efficiency is relatively low, it has unfavourable effect on the performance and service life of the power devices, and more unfavourable especially for parallel topology of a plurality of the IGBTs. And for a power module with large power, since thermal flux of a single power device is large, the heat dissipation can not be solved in the conventional all-metal heat dissipation manner.

SUMMARY OF THE PRESENT INVENTION

With respect to the heat dissipation problem which can not be solved in the conventional heat dissipation manner, a technical problem to be solved by the present invention is to provide a hybrid heat sink for a power module so as to promote heat dissipation efficiency of the power module.

In order to solve the above technical problem, the present invention provides a hybrid heat sink for a power module comprising a base, a first heat dissipation unit, and a second heat dissipation unit. The base is provided with at least one power module on one side thereof. The first heat dissipation unit is a first heat dissipation fin group which is composed of a plurality of heat dissipation fins intervally arranged and is located on the other side of the base. The second heat dissipation unit comprises a plurality of heat pipes and a first heat dissipation fin group, each of the heat pipes comprises an evaporating section, an adiabatic section, and a condensing section, the evaporating section is embedded in the base and close to the power module, the adiabatic section is located between the evaporating section and the condensing section and comprises an extension portion extending upwardly from a distal end of the evaporating section and a folding portion folded from a distal end of the extension portion, the second heat dissipation fin group is provided on the condensing sections of the heat pipes and is composed of a plurality of heat dissipation fins.

Moreover, the present invention provides a hybrid heat sink assembly for a power module comprising the two hybrid heat sinks provided opposite to each other, the first heat dissipation fin groups of the two hybrid heat sinks are provided in parallel and located at inner sides of the bases, and interval distances between the condensing sections of all the heat pipes and the first heat dissipation fin group in one of the hybrid heat sinks are larger than interval distances between the condensing sections of all the heat pipes and the first heat dissipation fin group in the other of the hybrid heat sinks The beneficial effects of the present invention are as follows, the first heat dissipation unit and the second heat dissipation unit commonly use the same base, an all-metal type heat sink is composed of the first heat dissipation unit and the base, a heat-pipe type heat sink is composed of the second heat dissipation unit and the base, the condensing sections of the heat pipes and the second heat dissipation fins thereon are located above the all-metal type heat sink. With such an arrangement, the hybrid heat sink is composed by two parts, i.e. the all-metal type heat sink and the heat-pipe type heat sink, so that an advantage that all-metal type heat sink is reliable and stable and has large thermal capacity and an advantage that the heat-pipe type heat sink has large heat dissipation area, rapid thermal conductivity, and a compact structure are combined together; since the power module is secured on the base, the whole hybrid heat sink has a compact structure, a small volume, a light weight, and high heat dissipation efficiency.

Hereinafter, the present invention will be described in details in conjunction with the drawings and the preferred embodiments which are not intended to limit the present invention.

Figure 1:
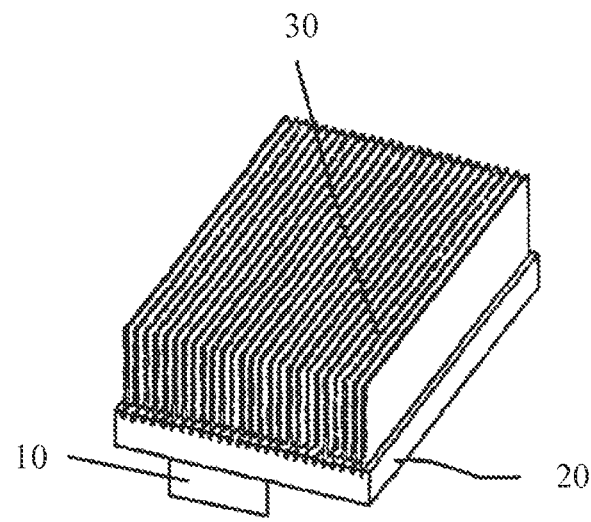
FIG. 1 is structural schematic diagram illustrating an all-metal type heat sink in background art.

The referential numerals for elements are described as follows.

10 power device
20 heat sink base
30 heat dissipation fin group
100, 200 hybrid heat sink
1 power module
2 base
3 first heat dissipation unit
31 first heat dissipation fin
4 second heat dissipation unit
41, 43, 44, 45, 46, 47 heat pipe
411 evaporating section
412 condensing section
413 adiabatic section
4131 extension portion
4132 folding portion
42 second heat dissipation fin group
421 through hole
422 through hole
5 fan
6 air channel
7 airflow guiding board

DESCRIPTION OF THE PREFERRED EMBODIMENTS

Hereinafter, technical solutions of the present invention will be described in details in conjunction with the drawings and the preferred embodiments, so as to further understand objects, solutions, and effects of the present invention but not to limit protection scopes of appended claims of the present invention.

A hybrid heat sink 100 of the present invention is applicable to a power module, such as a SVG, a MVD, an UPS, a wind power converter, and so on, with a large power and a high thermal flux and in which a power device is compactly arranged together for heat dissipation.

Figure 2:
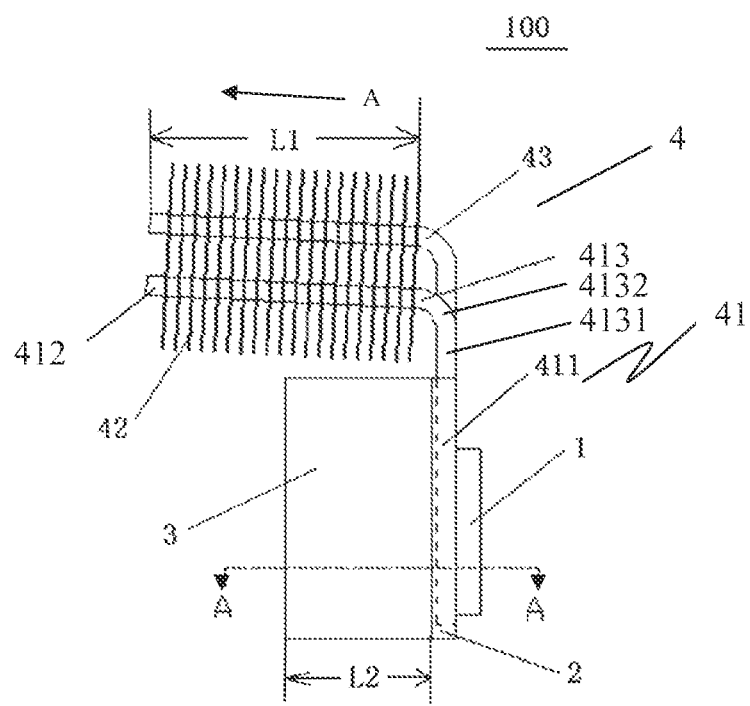
FIG. 2 is a structural schematic diagram illustrating a hybrid heat sink according to an embodiment of the present invention.
Figure 3:
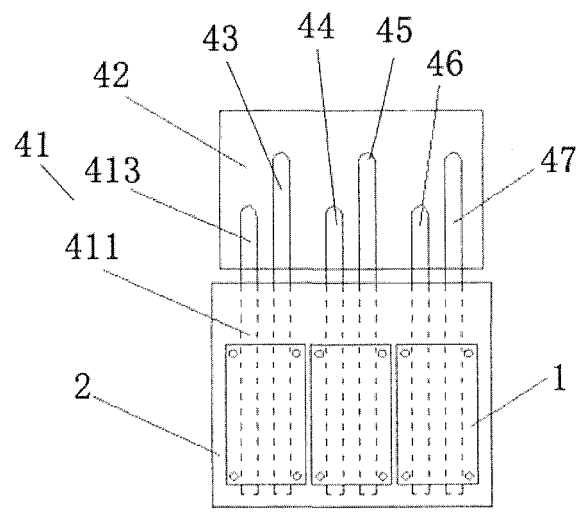
FIG. 3 is a right view of the hybrid heat sink in FIG. 2.

Referring to FIGS. 2-5, the hybrid heat sink 100 of the present invention comprises a base 2, a first heat dissipation unit 3, and a second heat dissipation unit 4, a power module 1 is located on one side of the base 2, the first heat dissipation unit 3 is located on the other side of the base 2, wherein the other side is a side opposite to the one side (referring to FIG. 2). The first heat dissipation unit 3 is a first heat dissipation fin group composed of a plurality of heat dissipation fins 31 intervally arranged (in order to distinguished from a heat dissipation fin of the second heat dissipation unit 4 later described, the heat dissipation fin herein is also referred to as a first heat dissipation fin), engagement of the base 2 and the first heat dissipation fins 31 may be an integral extruding structure, a welding fin structure, or an inserting fin type structure, and material of the first heat dissipation fins 31 may be copper or aluminum, therefore the first heat dissipation unit 3 may be regarded as an all-metal type heat sink composed of the first heat dissipation fin group and the base 2. The second heat dissipation unit 4 comprises a plurality of heat pipes 41, 43, 44, 45, 46, 47, the plurality of heat pipes have the same structures and will be described by taking one of the heat pipes as an example. The heat pipe 41 comprises an evaporating section 411, an adiabatic section 413, and a condensing section 412, the evaporating section 411 is provided in the base 2 and close to the power module 1, the evaporating section 411 may reduce spreading thermal resistance of the base 2, make a temperature of the base 2 uniform, and promote efficiency and heat dissipation ability of the all-metal type heat sink, the adiabatic section 413 is located between the evaporating section 411 and the condensing section 412 and comprises an extension portion 4131 extending upwardly from a distal end of the evaporating section 411 and a folding portion 4132 folded from a distal end of the extension portion 4131, the condensing section 412 is located above the first heat dissipation fin group and has a right angle or an obtuse angle to the evaporating section 411. Preferably, an angle between the condensing section 412 and the evaporating section 411 is 90~120 degree, so that the heat pipe 41 is a L-type shape as a whole, a second heat dissipation fin group 42 is provided on the condensing section 412 and the condensing section 412 has an interval with the first heat dissipation fin group, that is to say, the second heat dissipation fin group 42 does not contact the first heat dissipation fin group, so as to form a hybrid heat sink assembly as described later. After the second heat dissipation unit 4 employs the above structures, a heat-pipe type heat sink may be formed by the second heat dissipation unit 4 and the base 2.

The hybrid heat sink 100 with the above configuration may be regarded as a hybrid of the all-metal type heat sink and the heat-pipe type heat sink, and the all-metal type heat sink and the heat-pipe type heat sink commonly use the same heat dissipation base. When the all-metal type heat sink and the heat-pipe type heat sink are provided at a left side of the power module in a manner as shown in FIG. 2, the heat-pipe type heat sink is practically located above the all-metal type heat sink. The hybrid heat sink has the following advantages: an advantage that all-metal type heat sink is reliable and stable and has large thermal capacity and an advantage that the heat-pipe type heat sink has large heat dissipation area, rapid thermal conductivity, and a compact structure are combined together; since the power module is secured on the base, the present invention has a compact structure, a small volume, a light weight, and high heat dissipation efficiency. And the all-metal type heat sink and the heat-pipe type heat sink heat pipe are located at the same side of the base, which herein is the left side or a right side, the evaporating section 411 of the heat pipe embedded in the base 2 is provided perpendicular to a horizontal plane, the condensing section 412 is inclined at an angle with respect to the horizontal plane, so that easily a working liquid is easily returned, there is no dead volume, and the working liquid is not built up in the heat pipe.

In practical, a working medium in each of the heat pipes may be water, acetone, liquid ammonia, alcohol, or R134a refrigerant. Material of each of heat pipes may be copper or aluminum. Shape of the evaporating section of each of the heat pipes may be s circular pipe shape, a flat plate shape or a rectangular shape. Pipe diameters of the plurality of the heat pipes may be same or different. Depths of the heat pipes embedded in the base (i.e. a length of each of the evaporating sections 411) may be same or different. The heat pipe may employ a gravity-type heat pipe, a groove-type heat pipe, a sintered-type heat pipe or a mesh-type heat pipe. In order to lower cost, the gravity-type heat pipe is preferably employed. And the heat pipe may be sheathed or inserted into the base 2, engagement manner of the heat pipe and base 2 may also employ mechanical tight fitting, thermal adhesive bonding, or welding.

In order to promote heat dissipation efficiency, the second heat dissipation fin group 42 is composed of a plurality of heat dissipation fins intervally arranged on the condensing section(s) 412 (in order to distinguish from the first heat dissipation fin as previously described, the heat dissipation fin herein is also referred to as a second heat dissipation fin). Each of the second heat dissipation fins is provided with a plurality of through holes 421, 422, the plurality of through holes 421, 422 may be respectively engaged with the condensing sections 412 of the heat pipes, and the condensing sections of the plurality of the heat pipes are provided through the second heat dissipation fin group in a staggered arrangement manner, engagement manner of the second heat dissipation fin group 42 and the heat pipe(s) may employ mechanical clamping or welding. Preferably, an arrangement direction for the plurality of the second heat dissipation fins on the condensing section(s) 412 (as indicated by an arrow A shown in FIG. 2) is different from an arrangement direction for the plurality of the first heat dissipation fins 31 on the base 2 (as indicated by an arrow B shown in FIG. 4). With such a configuration, since the heat pipes have super thermal conductivity characteristics, they can rapidly transfer large quantity of heat yielded by the power module 1 in a very small temperature difference and thermal resistance to the second heat dissipation fin group 42 composed of the plurality of the second heat dissipation fins, thereby promoting efficiency of the heat sink. Moreover, the evaporating sections of the heat pipes provided inside the base 2 are located just below the power module 1, so heat yielded by the power module 1 may be directed into the heat pipes along shortest paths, thereby reducing conductive thermal resistance from the power module 1 to the heat pipes. Furthermore, gaps among the plurality of the second heat dissipation fins provided on the condensing sections of the heat pipes are small, thus heat dissipation area per volume unit is large and heat dissipation efficiency is high.

In practical invention, the number of the heat pipes and a width of the second heat dissipation fins 42 and the number of the second heat dissipation fins 42 on the heat pipes may be increased according to a value of the heat dissipation power and requirement on thermal resistance, positions of the heat pipes on the second heat dissipation fins 42 may employ a parallel or triangular arrangement, so as to make a temperature of the heat dissipation fin relative uniform, promote the ability of the heat sink, and reduce thermal resistance.

Figure 4:
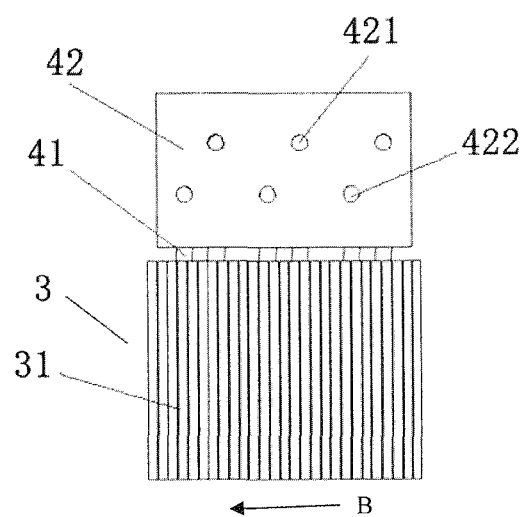
FIG. 4 is a left view of the hybrid heat sink in FIG. 2.
Figure 5:
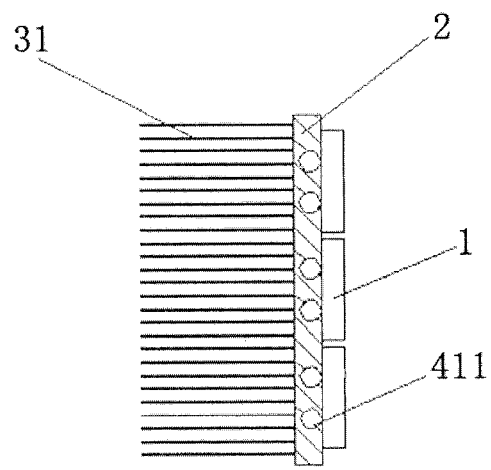
FIG. 5 is an A-A sectional view of FIG. 2.

Further referring to FIG. 2, FIG. 4, and FIG. 5, a plurality of the power modules is provided on the base 2, but only three power modules are shown in the figures as an example, each of the power modules corresponds to two heat pipes. Taking FIG. 2, FIG. 4, and FIG. 5 as an example, one of the power modules 1 corresponds to a heat pipe 41 (regarded as a first heat pipe) and a heat pipe 43 (regarded as a second heat pipe), another one of the power modules 1 corresponds to a heat pipe 44 (regarded as a heat pipe) and a heat pipe 45 (regarded as a second heat pipe), still another one of the power modules 1 corresponds to a heat pipe 46 (regarded as a first heat pipe) and a heat pipe 47 (regarded as s second heat pipe). A condensing section of the heat pipe 41 and a condensing section of the heat pipe 43 are not coplanar, a condensing section of the heat pipe 44 and a condensing section of the heat pipe 45 are not coplanar, a condensing section of the heat pipe 46 and a condensing section of the heat pipe 47 are not coplanar; the condensing section of the heat pipe 41, the condensing section of the heat pipe 44, and the condensing section of the heat pipe 46 are coplanar, the condensing section of the heat pipe 43, the condensing section of the heat pipe 45, and the condensing section of the heat pipe 47 are coplanar. That is, the condensing section of the first heat pipe and the condensing section of the second heat pipe for each of the power modules are not coplanar, the condensing sections of the first heat pipes for the plurality of the power modules are coplanar, and the condensing sections of the second heat pipes for the plurality of the power modules are coplanar. And pipe diameters of the heat pipes 41, 43, 44, 45, 46, 47 may be determined according to loss of the respective power modules, so as to efficiently dissipate heat and make the temperature of each of the power modules substantially uniform. The power modules may be closely against together, especially for the parallel IGBT power modules, so as to make a busbar connection distance short and reduce undesirable effects from leakage inductance, and so on.

In practical invention, a following configuration may be further employed: a plurality of the power modules are provided on the base 2, each of the power modules corresponds to one heat pipe, the condensing sections of the heat pipes respectively corresponding to the power modules are not coplanar.

Figure 6:
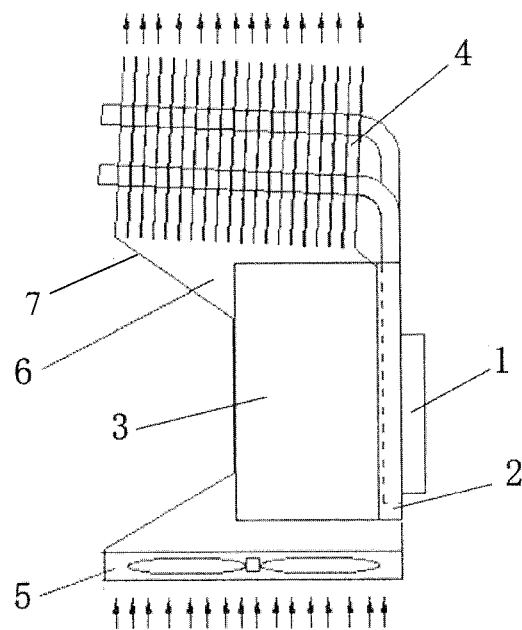
FIG. 6 is a structural schematic diagram illustrating a hybrid heat sink according to another embodiment of the present invention.

Referring to FIG. 6, in another embodiment of the present invention, the hybrid heat sink further comprises a fan 5 and an air channel 6, the fan 5 is located at a side of the first heat dissipation unit 3, and air flow yielded by the fan 5 is blown toward the first heat dissipation fin group and the second heat dissipation fin group 42 which is located on the condensing sections of the heat pipes via the air channel 6. In practical invention, the fan 5 may be located a lower side of the first heat dissipation fin group, the air channel 6 may be surrounded by an airflow guiding board 7 encircling the first heat dissipation unit 3, and air flow yielded by the fan 5 is blown toward the second heat dissipation fin group 42 along gaps in the first heat dissipation fin group (the gaps herein refers to gaps among the first heat dissipation fins) via the air channel 6; or, the fan 5 may be located at an upper side of the second heat dissipation fin group 42, the air channel 6 may be surrounded by an airflow guiding board 7 encircling the first heat dissipation unit 3, and air flow yielded by the fan 5 is blown toward the first heat dissipation unit 3 along gaps in the second heat dissipation fin group 42 (the gaps herein refers to gaps among the second heat dissipation fins) via the air channel 6. The installation and the arrangement manner of the air channel belong to a general knowledge in the art, for example, the fan is installed below or above the hybrid heat sink via a mounting frame, the air channel may be only provided to be capable of blowing the heat dissipation air flow toward the first heat dissipation fin group and the second heat dissipation fin group 42 which is located on the condensing sections of the heat pipes, therefore the description thereof is not given in details herein. With the hybrid heat sink according to the embodiment as shown in FIG. 6, in the operation, a part of heat yielded by the power modules 1 is transferred to the first heat dissipation fin group on the other side of the base 2 via the base 2, and cooling air passes through the first heat dissipation fin group and carries off the part of the heat; another part of the heat is transferred to the evaporating sections of the heat pipes, absorbed by liquids in the evaporating sections of the heat pipes, liquids are converted into vapors due to absorbing heat, vapors respectively pass through the adiabatic sections along internal cavities of the heat pipes and rapidly flow to the condensing sections of the heat pipes, release heat in the condensing sections and are respectively converted into liquids due to condensing, condensed liquids respectively return to the evaporating sections of the heat pipes along wall surfaces of the heat pipes, so as to perform a next cycle, but heat released by the vapors in the condensing sections is transferred to the second heat dissipation fin group 42 respectively via the wall surfaces of the heat pipes, cooling air flows through a surface of the second heat dissipation fin group 42 so as to carry off the heat in a convection manner, thereby realizing a purpose of heat dissipation for the power modules.

Figure 7:
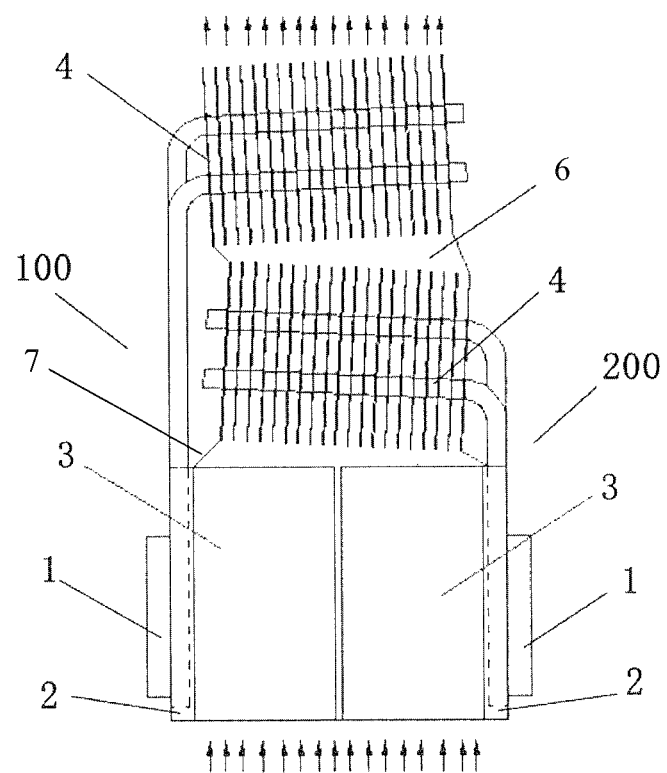
FIG. 7 is a structural schematic diagram illustrating a hybrid heat sink assembly according to an embodiment of the present invention.

Referring to FIG. 7, the present invention further provides a hybrid heat sink assembly for a power module, the hybrid heat sink assembly comprises hybrid heat sinks 100, 200 opposite to each other, each of the hybrid heat sinks has a same structure as that of the hybrid heat sink in the previous embodiment, since the single hybrid heat sink has been described in the previous text in details, hereinafter specific combination of the two hybrid heat sinks will be described. As shown in FIG. 7, first heat dissipation fin groups of the two hybrid heat sinks are provided in parallel and located at inner sides of bases 2, interval distances between the condensing sections of all the heat pipes and the first heat dissipation fin group in the hybrid heat sink 100 are larger than interval distances between the condensing sections of all the heat pipes and the first heat dissipation fin group in the hybrid heat sink 200. With such an arrangement, the condensing sections of the heat pipes and the second heat dissipation fin group in the hybrid heat sink 100 are located above the condensing sections of the heat pipes and the second heat dissipation fin group in the hybrid heat sink 200. Preferably, when the hybrid heat sink assembly comprises a fan and an air channel, the two hybrid heat sinks commonly use one fan and one air channel, i.e., the air channel 6 is surrounded by an airflow guiding board 7 which encircles the first heat dissipation units and the second heat dissipation fin groups of the two hybrid heat sinks at the same time, a fan (the fan is not shown in FIG. 7) is located at a side of the two first heat dissipation units 3, in a case that heat pipes are arranged vertically with respect to the horizontal plane, the fan is located at an upper side or a lower side of the two first heat dissipation units, so that air flow yielded is blown toward the second heat dissipation fin groups on the condensing sections along gaps in the first heat dissipation fin groups via the air channel 6, or the air flow yielded is blown toward the first heat dissipation fin groups along gaps in the second heat dissipation fin groups via the air channel 6.

That is to say, the hybrid heat sink assembly is formed by combining the two hybrid heat sinks 100, 200 back-to-back. Cooling air flows through the first heat dissipation fin groups and the second heat dissipation fin groups 42 from down to up (or from up to down) and carries off heat so as to attain the purpose of heat dissipation. In addition that the hybrid heat sink assembly has advantages as obtained from single hybrid heat sink previously described, since two hybrid heat sinks may commonly use one air channel and one fan, the hybrid heat sink assembly has high space utilization efficiency and has a more compact structure.

Certainly, the present invention may have many other embodiments. It is obvious for the person skill in the art to make various modifications and variations without departing from the spirit and scope of the present invention, these modification and changes should be fallen within the scope of the appending clams and equivalents thereof of the present invention.

What is claimed is:

1. A hybrid heat sink assembly for power modules, comprising two hybrid heat sinks provided opposite to each other, each of the hybrid heat sinks comprising:
   a base provided with at least one power module of the power modules on one side thereof;
   a first heat dissipation unit as a first heat dissipation fin group which is composed of a first plurality of heat dissipation fins intervally arranged and is located on another side of the base; and
   a second heat dissipation unit comprising a plurality of heat pipes and a second heat dissipation fin group, each of the heat pipes comprising an evaporating section provided in the base and adjacent to the at least one power module, a condensing section, and an adiabatic section located between the evaporating section and the condensing section, the adiabatic section comprising an extension portion extending upwardly from a distal end of the evaporating section and a folding portion folded from a distal end of the extension portion, and the second heat dissipation fin group being provided on each condensing section of the heat pipes and being composed of a second plurality of heat dissipation fins;
   wherein the first heat dissipation fin group of a first one of the two hybrid heat sinks is provided in parallel to the first heat dissipation fin group of a second one of the two hybrid heat sinks, each first heat dissipation fin group of the first one of the two hybrid heat sinks adjacent to the first heat dissipation fin group of the second one of the two hybrid heat sinks, the first heat dissipation fin group located at an inner side of the respective base, and an interval distance between each condensing section of all the heat pipes within one of the first one and the second one of the two hybrid heat sinks and the first heat dissipation fin group in the one of the first one and the second one of the hybrid heat sinks is larger than an interval distance between each condensing section of all the heat pipes within another of the first one and the second one of the hybrid heat sinks and the first heat dissipation fin group in the another of the first one and the second one of the hybrid heat sinks.

2. The hybrid heat sink assembly for the power modules according to claim 1, wherein for each of the hybrid heat sinks, the first heat dissipation fin group and the base are engaged as an all-metal type heat sink, and engagement manner of the first plurality of heat dissipation fins of the first heat dissipation fin group and the base employs an integral extruding structure, a welding structure, or an insertion fin type structure.

3. The hybrid heat sink assembly for the power modules according to claim 1, wherein for each of the hybrid heat sinks, the extension portion of a first heat pipe of every two adjacent heat pipes of the plurality of the heat pipes of the second heat dissipation unit has a different length than a second heat pipe of the every two adjacent heat pipes, and each condensing section of the plurality of the heat pipes of the second heat dissipation unit is provided through the second heat dissipation fin group, the condensing section of each of the heat pipes is arranged in a staggered manner.

4. The hybrid heat sink assembly for the power modules according to claim 3, wherein each of the heat pipes is a L-type shape and a folded angle thereof is a right angle or an obtuse angle.

5. The hybrid heat sink assembly for the power modules according to claim 1, wherein for each of the hybrid heat sinks, the at least one power module is a plurality of the power modules, the plurality of the power modules are provided on the respective base, each of the plurality of the power modules corresponds to one heat pipe or a plurality of the heat pipes based on a value of heat dissipation power and a size of each of the plurality of power modules.

6. The hybrid heat sink assembly for the power modules according to claim 1, wherein the two hybrid heat sinks commonly use one fan and one air channel, the one fan is located at a side of the first heat dissipation groups of each of the two hybrid heat sinks or at a side of the second heat dissipation groups of each of the two hybrid heat sinks, and air flow yielded by the one fan is blown toward each of the first heat dissipation fin groups and each of the second heat dissipation fin groups via the one air channel.

7. The hybrid heat sink assembly for the power modules according to claim 6, wherein the one air channel is surrounded by a single airflow guiding board, the first heat dissipation fin groups and the second heat dissipation fin groups of the two hybrid heat sinks at the same time, and the air flow yielded by the one fan is blown toward the second heat dissipation fin groups along gaps in the first heat dissipation fin groups via the one air channel.

8. The hybrid heat sink assembly for the power modules according to claim 6, wherein the one air channel is surrounded by a single airflow guiding board, the first heat dissipation fin groups and the second heat dissipation fin groups of the two hybrid heat sinks at the same time, and the air flow yielded by the one fan is blown toward the first heat dissipation fin groups along gaps in the second heat dissipation fin groups via the one air channel.

\* \* \* \* \*